United States Patent
Fornage

(10) Patent No.: US 8,466,582 B2
(45) Date of Patent: Jun. 18, 2013

(54) METHOD AND APPARATUS FOR APPLYING AN ELECTRIC FIELD TO A PHOTOVOLTAIC ELEMENT

(75) Inventor: Martin Fornage, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 55 days.

(21) Appl. No.: 13/310,249

(22) Filed: Dec. 2, 2011

(65) Prior Publication Data

US 2012/0139349 A1 Jun. 7, 2012

Related U.S. Application Data

(60) Provisional application No. 61/459,000, filed on Dec. 3, 2010.

(51) Int. Cl.
*H02J 1/00* (2006.01)
*H02J 3/00* (2006.01)

(52) U.S. Cl.
USPC .......... 307/82; 427/97.1; 427/96.3; 427/97.4; 427/98.4; 427/99.2

(58) Field of Classification Search
USPC ................................ 307/43, 78, 81
See application file for complete search history.

(56) References Cited

U.S. PATENT DOCUMENTS

| | | | |
|---|---|---|---|
| 3,928,073 A | 12/1975 | Besson et al. | |
| 5,215,599 A * | 6/1993 | Hingorani et al. | 136/255 |
| 2007/0204899 A1 | 9/2007 | Boyd, Sr. | |
| 2009/0262523 A1* | 10/2009 | Chen | 362/183 |
| 2011/0291606 A1* | 12/2011 | Lee | 320/101 |
| 2012/0035871 A1* | 2/2012 | Cofta et al. | 702/62 |
| 2012/0081088 A1* | 4/2012 | Park | 323/282 |

FOREIGN PATENT DOCUMENTS

| | | |
|---|---|---|
| JP | 58098987 A | 6/1983 |
| JP | 2006-066550 | 3/2006 |
| WO | WO 92/20104 | 11/1992 |

OTHER PUBLICATIONS

International Search Report and Written Opinion mailed Jul. 19, 2012 for PCT Application No. PCT/US2011/063234, 9 pages.

* cited by examiner

*Primary Examiner* — Rexford N Barnie
*Assistant Examiner* — Toan Vu
(74) *Attorney, Agent, or Firm* — Moser Taboada

(57) ABSTRACT

A method and apparatus for applying an electric field to a photovoltaic element. In one embodiment, the apparatus comprises at least one photovoltaic (PV) cell having a P-N junction; and a voltage supply for (i) converting a first voltage to an e-field voltage, the first voltage generated local to the at least one PV cell, and (ii) coupling the e-field voltage to the at least one PV cell to create an electric field extending across the P-N junction.

17 Claims, 7 Drawing Sheets

METHOD AND APPARATUS FOR APPLYING AN ELECTRIC FIELD TO A PHOTOVOLTAIC ELEMENT

CROSS-REFERENCE TO RELATED APPLICATIONS

This application claims benefit of U.S. provisional patent application Ser. No. 61/459,000, filed Dec. 3, 2010, which is herein incorporated in its entirety by reference.

BACKGROUND OF THE INVENTION

1. Field of the Invention

Embodiments of the present invention generally relate to photovoltaic elements and, more specifically, to a method and apparatus for applying an electric field to a photovoltaic element.

2. Description of the Related Art

A conventional photovoltaic cell is configured to convert solar energy to electrical energy by photovoltaic effect. A typical photovoltaic cell is encapsulated as a module that includes a sheet of glass on a front side for protecting a semiconductor device from the environment while enabling light to enter the semiconductor device that performs the light to electric current conversion. The conversion is performed at a P-N junction of the semiconductor device. The conversion is very inefficient (i.e., typically less than 20% of the energy of the photons is converted to electric current). To enhance the efficiency of converting light to electric current, an electric field can be applied across the P-N junction. However, in a typical installation of a practical power generation system, a DC power source is not readily available at the location of a photovoltaic cell to supply DC voltage to form the electric field.

Accordingly, there is a need for a method and apparatus for applying an electric field to a photovoltaic element.

SUMMARY

Embodiments of the present invention generally include a method and apparatus for applying an electric field to a photovoltaic element. In one embodiment, the apparatus comprises at least one photovoltaic (PV) cell having a P-N junction and a voltage supply for (i) converting a first voltage to an e-field voltage, the first voltage generated local to the at least one PV cell, and (ii) coupling the e-field voltage to the at least one PV cell to create an electric field extending across the P-N junction.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention relate to a method and apparatus for applying an electric field to at least one photovoltaic cell.

Figure 1:
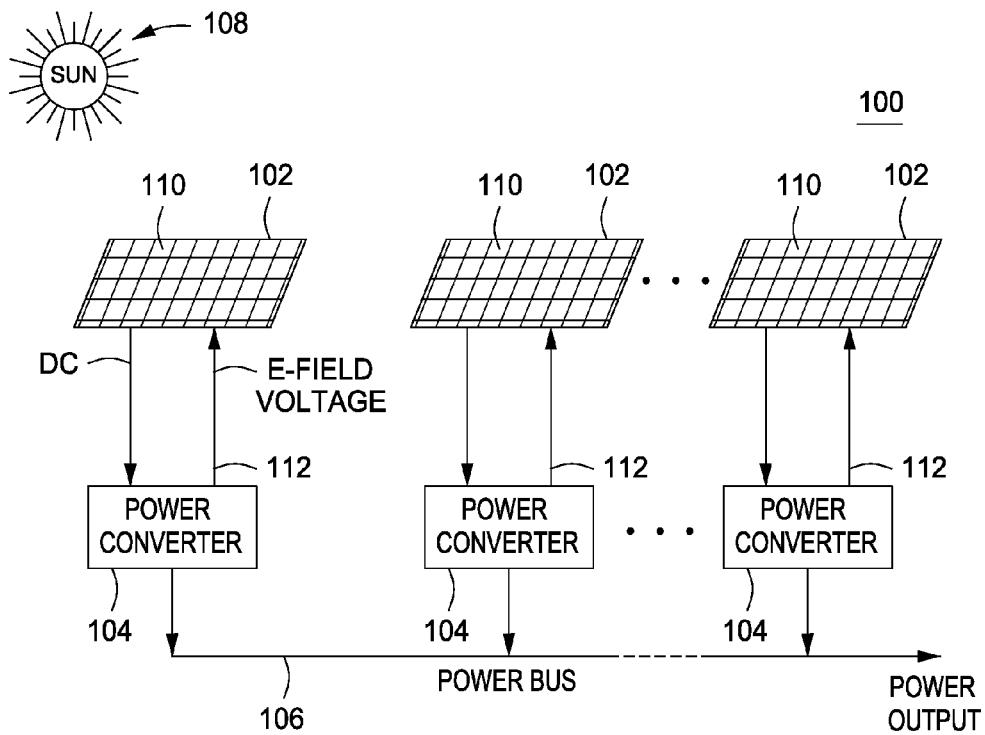
FIG. 1 is a simplified block diagram of a photovoltaic power generation system according to one or more embodiments.

FIG. 1 is a simplified block diagram of a photovoltaic power generation system 100 according to at least one embodiment. The photovoltaic power generation system 100 comprises a plurality of photovoltaic (PV) modules 102, a plurality of power converters 104 and a power bus 106. Each PV module 102 comprises an array of photovoltaic cells 110. The individual cells may be connected to one another in strings (rows or columns) or in blocks. The individual cells, blocks or strings may be connected to form an output voltage for a PV module 102. The plurality of PV modules 102 are configured to convert solar energy into direct current (DC), wherein the solar energy is obtained from the sun 108 or another source of photons. The DC power from each PV module 102 is applied to an associated power converter 104. Each power converter 104 converts the DC power from the module 102 (i.e., a first DC power) into a second DC power and, in some embodiments, into an AC power. In some embodiments, the second DC power has a higher or lower voltage than the DC power produced by the PV module 102. In one or more embodiments, each converter 104 in the plurality of power converters 104 is configured to generate an electric field voltage (e-field voltage) responsive to the generated DC power. The e-field voltage (conductor 112) is applied to each of the photovoltaic cells 110 to create and maintain an electric field proximate the P-N junction of each photovoltaic cell 110 within each photovoltaic module 102. The power bus 106 is coupled to output terminals of the plurality of power converters 104.

In some embodiments, the power bus 106 may coupled the power generated by the power converters 104 to one or more appliances and/or to a commercial power grid. Additionally or alternatively, generated energy may be stored for later use; for example, the generated energy may be stored utilizing batteries, heated water, hydro pumping, $H_2O$-to-hydrogen conversion, or the like. In some alternative embodiments, the PV modules 102 may all be coupled to a single power converter 104 (i.e., a centralized power converter).

Figure 2:
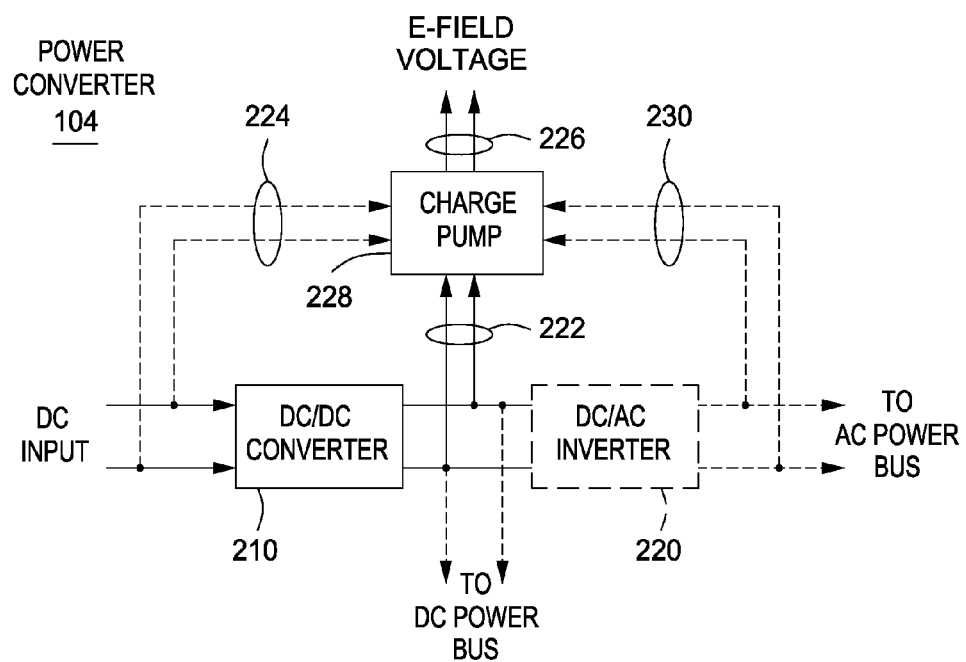
FIG. 2 is a simplified block diagram of a power converter according to one or more embodiments.

FIG. 2 is a simplified block diagram of a power converter 104, according to at least one embodiment. The power converter 104 includes a DC-to-DC converter (DC/DC converter) 210 coupled to an optional DC-to-AC inverter (DC/AC inverter) 220. The DC/DC converter 210 is configured to couple a DC voltage along path 222 to a charge pump 228, which generates an E-Field voltage output. The DC/DC converter 210 produces a second DC power derived from the DC power of the PV module. The second DC power may have a voltage that is higher or lower than the DC voltage generated by the PV module (i.e., a first DC power). In some embodiments, the second DC power is coupled to the power bus 106 without further processing (i.e., the power bus 106 is a DC bus). In other embodiments, the second DC power is coupled to a DC/AC inverter 220. The DC/AC inverter 220 processes the second DC power to generate an AC power output for supplying to an AC power bus (i.e., the power bus 106 is an AC bus). The e-field voltage output is applied to a transparent electrode 36 of FIG. 3 or electrode 500 of FIG. 5 below to generate an electric field within the PV module 102. The charge pump 228 generates a voltage having a magnitude of 1000's of volts. In one embodiment, the charge pump 228 receives a voltage from the DC/DC converter 210 on path 222. In other embodiments, the charge pump 228 may receive a voltage on path 224 from the PV module 102 or on path 230 from the DC/AC inverter 220. The charge pump 228 creates a voltage (e-field voltage) on path 226. In some embodiments, the voltage generated by the charge pump 228 may be varied, for example based on present operating conditions (e.g., illumination level, temperature, and the like), to optimally enhance the efficiency of one or more PV cells 110 in converting received solar energy to electric current.

Figure 3:
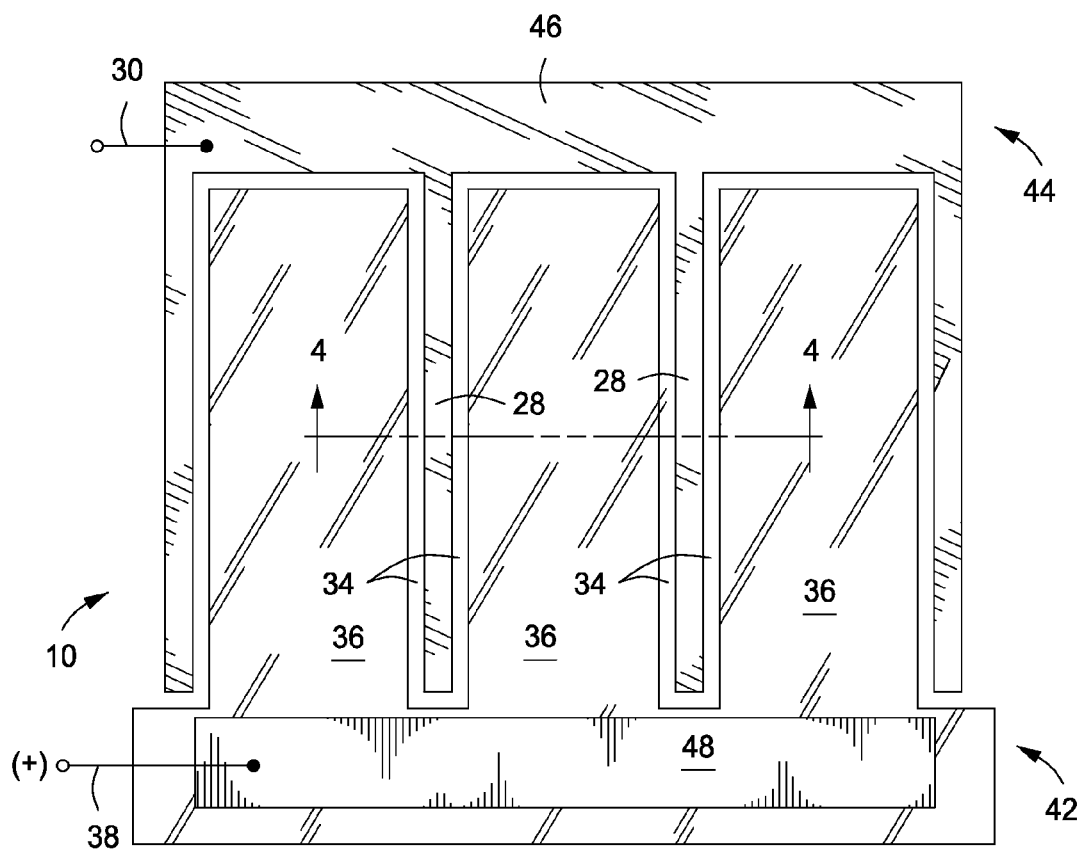
FIG. 3 is a plan view of one form of a photovoltaic cell according to one or more embodiments.
Figure 4:
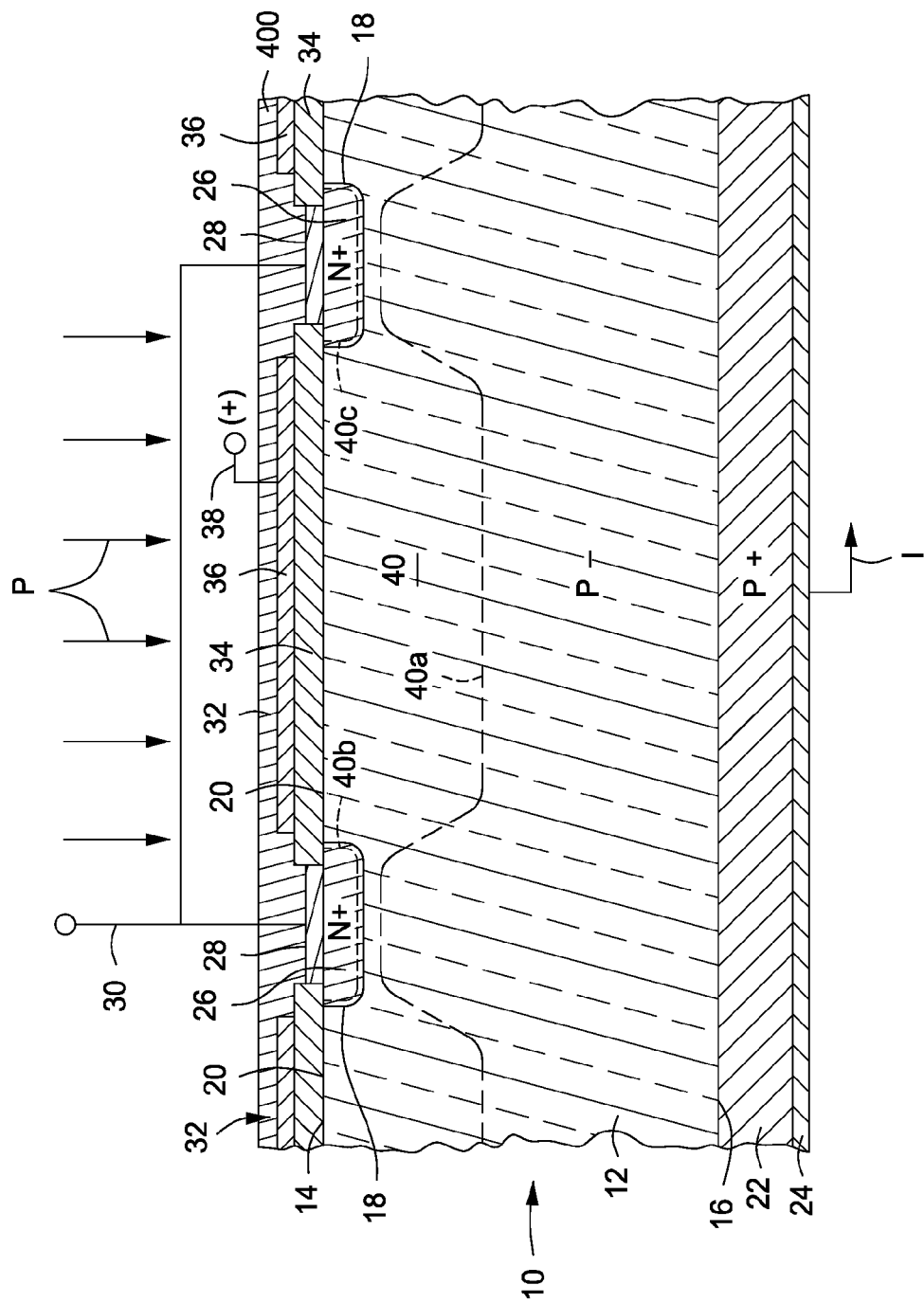
FIG. 4 is a partially schematic enlarged vertical sectional view taken along line 4-4 of FIG. 3 according to one or more embodiments.

FIG. 3 is a plan view of one form of a photovoltaic (PV) cell 10 according to one or more embodiments. FIG. 4 is a partially schematic enlarged vertical sectional view taken along line 4-4 of photovoltaic cell 10 of FIG. 3 according to one or more embodiments. This particular embodiment depicts an e-field electrode 36 imbedded in the PV cell 10. In other embodiments, the electrode 36 may be imbedded in the glass 502/504 as described below with respect to FIG. 5. In one or more embodiments, the PV cell 10 is one form of the PV cell 110 of FIG. 1.

Both FIGS. 3 and 4 illustrate an embodiment of an advanced photovoltaic cell 10 constructed in accordance with the present invention for converting solar or other photon energy P into electrical energy extracted from the photovoltaic cell 10 in the form of electrical current, referred to as a photo-current I. The photovoltaic cell 10 may be constructed using conventional photovoltaic cell fabrication technology, along with conventional integrated circuit fabrication technology. Referring to FIG. 4, the photovoltaic cell 10 includes a substantially neutral base layer 12 which may be of an intrinsic semiconductor material, that is, one which is pure or undoped and has an equal number of holes and electrons. However, the base layer 12 is an extrinsic semiconductor which is lightly doped with a first polarity, such as a positive polarity to form a region, that is, one having a slight excess number of holes (positive charge carriers). The concepts and methods of lightly and heavily doping semiconductor materials are known to those skilled in the art of semiconductor doping. The base layer has opposing first and second surfaces, here, oriented with the first surface as an incident surface 14, and the second surface as a collection surface 16. In operation, the photovoltaic cell 10 is positioned with the incident surface 14 directed toward the source of photons P.

The incident surface 14 of photovoltaic cell 10 has at least one recessed incident contact region 18. The incident surface 14 also has an incident biasing region 20 adjacent to and surrounding the contact regions 18. A heavily doped collection layer 22 lies adjacent the base layer collection surface 16. The collection layer 22 is of an extrinsic semiconductor doped to have the first polarity, that is, positively doped to provide a P$^+$ region. The collection layer 22 is sandwiched between the base layer 12 and a collector plate or electrode 24 of a conductive material. The collector electrode 24 may be a conventional collector plate or grid. The photo-current I generated by the photovoltaic cell 10 is collected by the collector electrode 24 and delivered to the power converter 104. A heavily doped incident layer 26 lies adjacent the base layer incident surface 14 and is substantially confined within the incident contact regions 18. The incident layer 26 is of an extrinsic semiconductor doped to have a second polarity opposite the first polarity. Thus, the illustrated incident layer 26 is doped negatively to provide an N+ region having an excess number of electrons (negative charge carriers). The interface of the incident layer 26 with the base layer 12 provides a P-N junction within the photovoltaic cell, substantially defined by the walls of the recessed contact regions 18.

Furthermore, the sandwiching of the respective layers 26, 12 and 22 provides what is known as a complementary cell structure. To complete a current path through the photovoltaic cell 10 for the generated photo-current I, an incident electrode strip or contact 28 of a conductive material is electrically coupled to the incident layer 26 to provide an ohmic contact region. The electrode 28 may be electrically coupled to the incident layer 26 in a conventional manner so layer 26 is sandwiched between the base layer 12 and electrode 28. A load conductor 30, completes the return path for the photo-current I from the power converter 104 to the incident electrode 28. The efficiency of the photovoltaic cell 10 is increased over that of the earlier known photovoltaic cells by including means for applying an external electric field to the photovoltaic cell 10. This means for applying an external electric field may be an enhancement layer 32 adjacent the base layer incident biasing region 20. In one embodiment, the enhancement layer 32 may comprise a layered metal oxide semiconductor (MOS) structure having an insulating dielectric layer 34, such as an oxide layer, overlaying the biasing region 20 and a portion of the incident layer 26. Such a MOS structure also includes a conductive layer 36, such as a metallic layer, overlaying the dielectric layer 34. For example, if the base layer 12 is of a silicon semiconductor material, the dielectric layer 34 may be of silicon dioxide ($SiO_2$).

In a one embodiment, the conductive layer 36 (e-field electrode) is a transparent conductive film, such as cassiterite ($SnO_2$) or a lead-tin oxide alloy. The enhancement layer 32 is electrically coupled to a positive voltage source (power converter 104 of FIGS. 1 and 2) by a bias conductor 38 (illustrated schematically in FIGS. 3 and 4) to provide a positive bias (+) to the enhancement layer. The positive bias of enhancement layer 32 for the photovoltaic cell 10 enhances the movement of charge carriers from the lightly doped base layer to at least one of the heavily doped collection and incident layers. The enhancement layer 32 provides an enhanced depletion region 40 in the base layer 12 and the incident layer 26, which is larger than the depletion region in conventional photovoltaic cells. In a depletion region, the number of positive carrier holes substantially equals the number of negative carrier electrons. In effect, the influence of the excess charge carriers provided by doping the semiconductor is negated or depleted by the presence of charge carriers having the opposite polarity within the depletion region. Biasing the enhancement layer 32 by applying an externally generated electric field to the semiconductor draws more charge carriers into the depletion region than that experienced in a conventional photovoltaic cell. The enhanced depletion region 40 formed around the P-N junction when photon radiation impinges on the semiconductor enhances the operating efficiency of the photovoltaic cell 10 as described further below. For example, using the MOS structure embodiment, the enhancement layer 32 may be configured as an enhancement grid 42, and the incident electrode strips 28 as an incident electrode grid 44.

The very high resistance to current flow of the enhancement grid 42 electrically isolates grid 42 from the incident electrode grid 44. The incident electrode strips 28 are all electrically coupled together by a photo-current bus bar 46. The load conductor 30 couples the bus bar 46 to the power converter 104 receiving the photo-current I from the collector electrode 24. Similarly, the portions of the enhancement grid 42 are all electrically coupled together by an incident enhancement bus bar 48. The enhancement bus bar 48 is electrically coupled to the power converter 104 by the bias conductor 38. As previously mentioned, fabrication of the enhancement grid 42 may be accomplished by using established LSI (large scale integrated) fabrication technology, such as that used to fabricate MOS transistors. The semiconductor device of the photovoltaic cell is protected by a glass layer or substrate 400.

The term "diffusion length" refers to the distance which the charge carrier travels during the carrier lifetime. This carrier lifetime depends upon the diffusivity of the material through which the charge carrier is traveling, as well as the electrical forces within the material. Thus, the photovoltaic cell efficiency may be improved if the charge carrier is collected at the collector electrode 24 before recombination occurs, so the collected charge carrier can contribute to the photo-current output of the cell. This improvement is realized by operating photovoltaic cell 10 as described below. In operation, using the MOS structure embodiment for example, a positive polarity bias is applied to the enhancement grid 42 by the e-field conductor 38 to provide an external electric field within the base layer 12. Subjecting the grid 42 to a positive potential creates an enhanced depletion region 40 which is thicker than the depletion region surrounding a conventional photovoltaic cell P-N junction. When the photovoltaic cell 10 is exposed to the sun or another photon source, the photons P impinging on the photovoltaic cell create electron-hole pairs in the depletion region 40. The enhanced depletion region 40 attracts a larger number of electrons than in conventional photovoltaic cells, and many more electrons are directed toward the P collector layer 22. Thus, the larger depletion region 40 enhances the photo-current I and improves the overall efficiency of photovoltaic cell 10 over that of conventional photovoltaic cells.

In this manner, the enhancement layer 32, being exposed to an electric field, increases the number of negative charge carriers flowing from the radiated side of the photovoltaic cell to the collector electrode 24, over that of conventional photovoltaic cells. This electric field-induced effect advantageously provides a photovoltaic cell 10 having a higher efficiency that other known solar cells. This increased efficiency is expected because the solar spectrum contains considerably more energy in the range where absorption occurs within the base layer 12. The range of absorption refers to the solar spectral range, with specifically, the AM0 and AM2 solar spectrums being of interest here. The AM0 spectrum concerns the solar irradiance in an outer space environment, whereas the AM2 spectrum concerns the solar irradiance on the earth's surface for average weather, atmospheric and environmental conditions. Increasing the range of absorption in both the AM0 and AM2 solar spectrums is particularly advantageous since the photovoltaic cell of the present invention may be used in both earth and outer space environments. The external electric field provided by the enhancement layer 32 is expected to increase the spectral response, that is, the output voltage for all photon wavelengths received by the photovoltaic cell, by approximately 25% over that of conventional photovoltaic cells. This increase in spectral response translates to an approximate 20% increase in the short circuit current rating of the photovoltaic cell over the rating of other known photovoltaic cells. The external electric field provided by the enhancement layer 32 also minimizes or virtually eliminates recombination-induced degradation of the photovoltaic cell 10. The surface recombination velocity under the enhancement layer 32 is much smaller than that within the incident layer 26.

Figure 5:
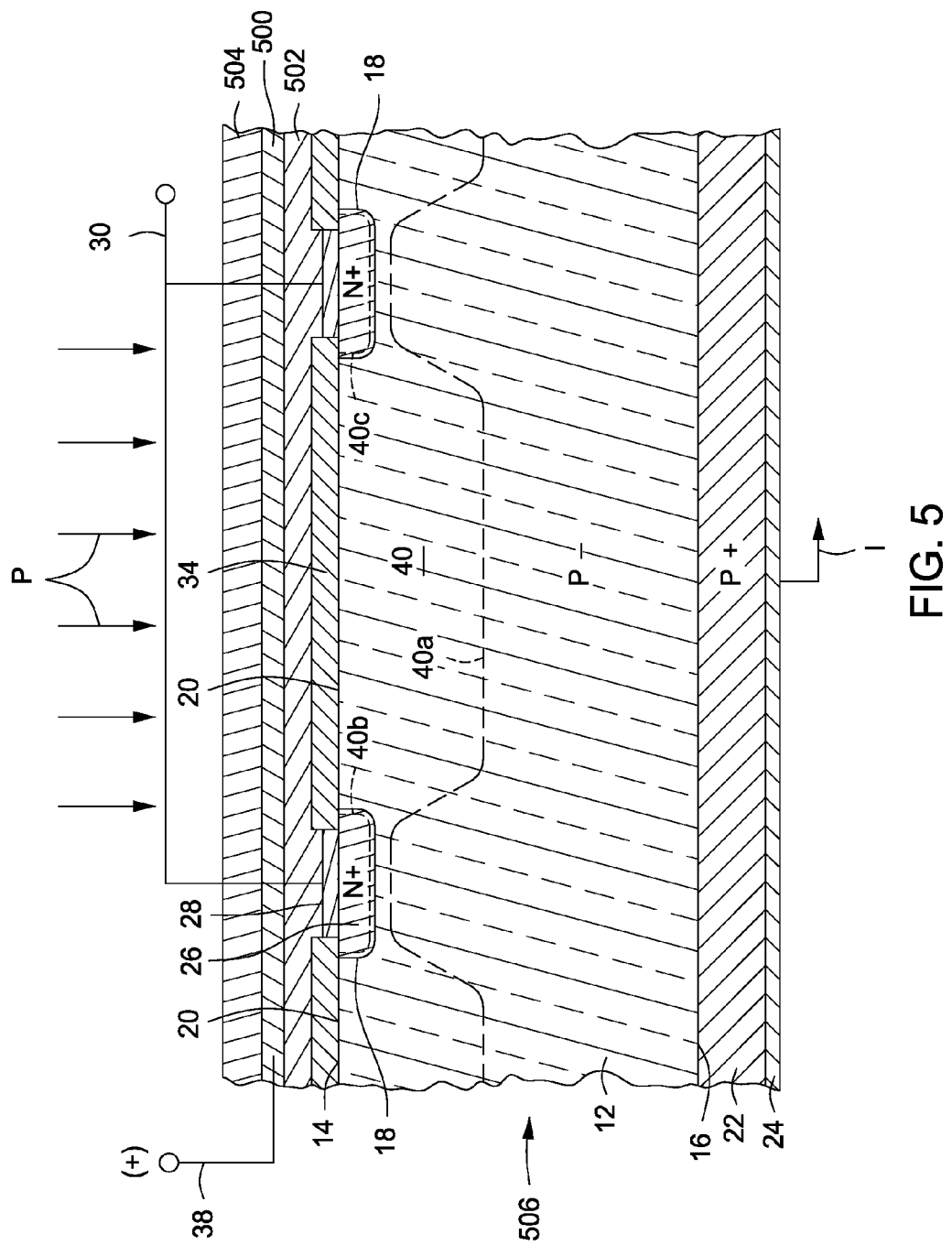
FIG. 5 depicts a cross-section of a photovoltaic cell according to one or more embodiments.

As an alternative embodiment, FIG. 5 depicts a cross-section of a PV cell 506 having a similar construction of the conversion element (P-N junction and depletion region) as the PV cell 10 of FIG. 4. In the alternative embodiment, the electrode 500 is embedded between a first glass layer 502 and a second glass layer 504. In one embodiment the electrode 500 may extend across the entire module 102. Alternatively, the electrode 500 may span a plurality of PV cells 110 (e.g., across a string or a block of PV cells). Further, the electrode 500 may be formed above individual PV cells 110. In one or more embodiments, the PV cell 506 is one form of the PV cell 110 of FIG. 1.

In each embodiment of FIG. 4 or 5, the electrode 36 or 500 is coupled to the charge pump 228 of FIG. 2. The charge pump 228 supplies a DC voltage (on the order of 1000s of volts) at a current level on the order of 10 s of nano-amperes. The voltage from the charge pump 228 is applied across the e-field electrode 36/500 and the collector electrode 24.

In an embodiment where the e-field electrode 500 covers one or more PV cells 110, an individual charge pump 228 may be coupled to each electrode 500 to establish an e-field for a particular group of PV cells 110 or an individual cell 110. The charge pump 228 may then be controlled to "tune" the efficiency of each group or individual PV cell 110. As such, an entire PV module 102 may have the operation of individual cells 110 or zones of cells 110 optimized in view of the present environmental conditions (e.g., illumination level, temperature, and the like).

Figure 6:
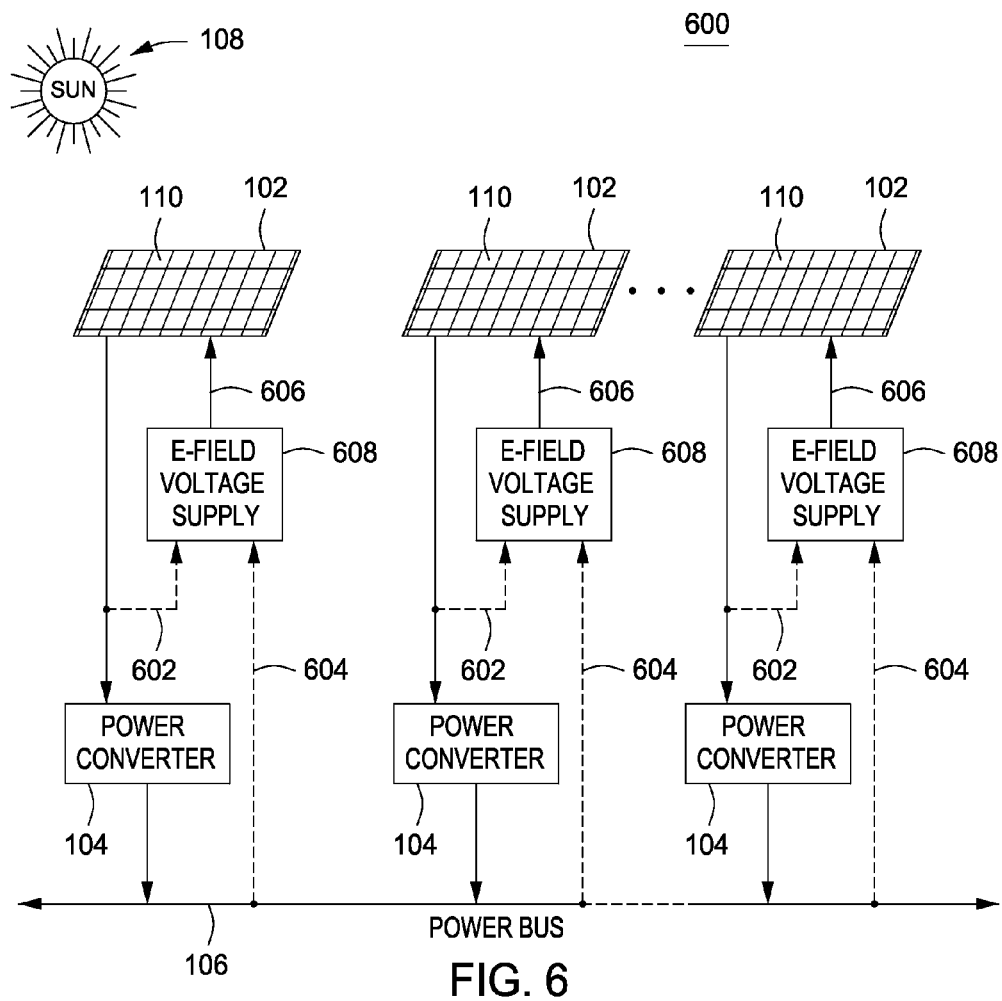
FIG. 6 is a block diagram of a PV power generation system according to one or more embodiments.

FIG. 6 depicts a block diagram of an alternative embodiment of a PV power generation system 600. The system 600 has similar components to system 100 of FIG. 1. In the system 600, the e-field voltage is generated within an e-field voltage supply 608 that is separate and distinct from the power converter 104. The supply 608 generates the e-field voltage from either the DC voltage at 602 (i.e., the DC voltage generated by the PV module 102) or the AC voltage at 604 (i.e., the AC voltage on the power bus 106). The e-field voltage from the e-field voltage supply 608 is coupled to the PV module 102 via path 606. The e-field voltage supply 608 may be any one of a number of well known circuits for converting a DC or AC voltage to a specific DC voltage to be used as the e-field voltage. Such supply circuits include, but are not limited to, for example, switching power supplies. In some alternative embodiments, a DC voltage generated by the power converter 104 may be coupled to the e-field voltage supply 608 for generating the e-field voltage.

By applying the DC voltage to create the electric field from a local voltage source, e.g., the power converter, additional lengthy wiring and/or sources are not required. In many power generation systems, the DC/DC converters or DC/AC inverters are attached directly to the PV modules. In other embodiments, the DC/DC converter or DC/AC inverter may be integrated into the physical structure of the photovoltaic module. As such, the DC voltage used for generating the electric field is extracted from the DC/DC conversion stage of the converter or inverter.

Figure 7:
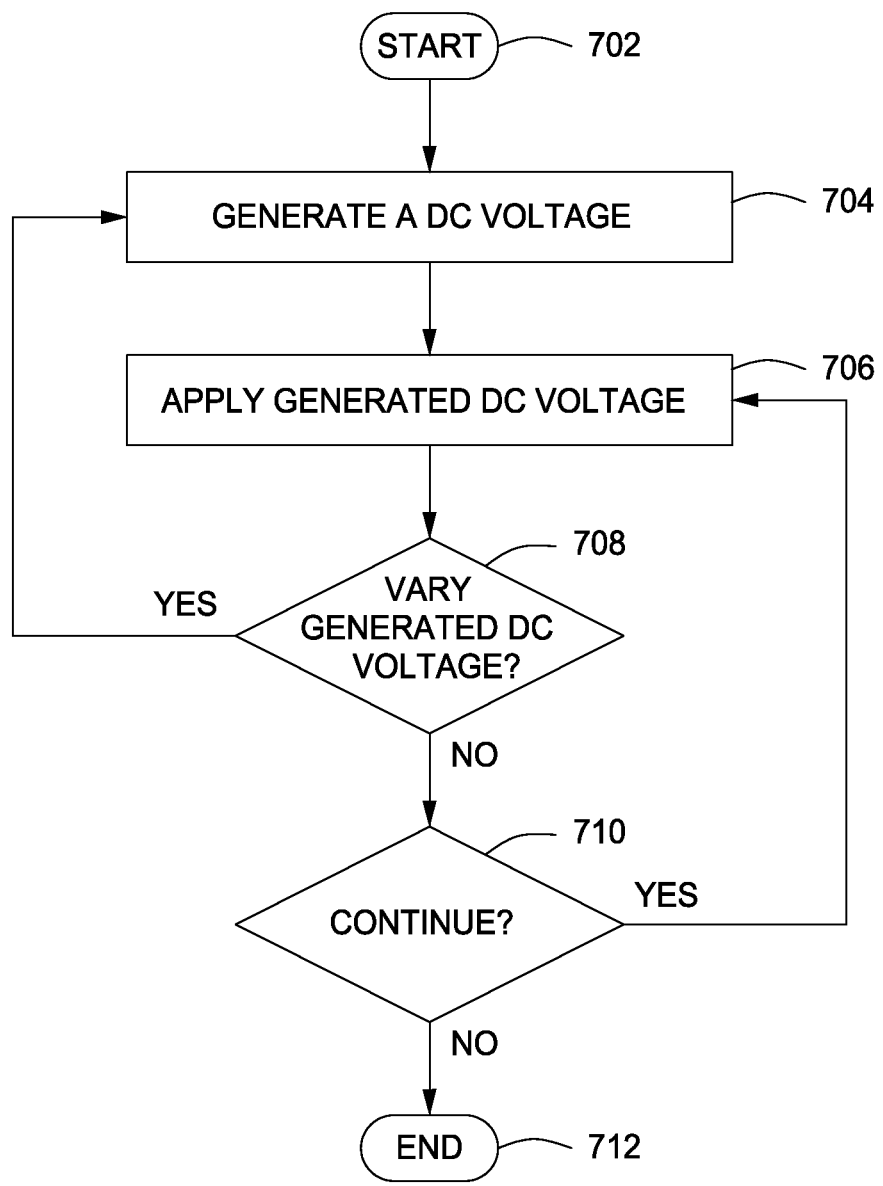
FIG. 7 is a flow diagram of a method for applying an electric field to a photovoltaic element in accordance with one or more embodiments of the present invention.

FIG. 7 is a flow diagram of a method 700 for applying an electric field to a photovoltaic element in accordance with one or more embodiments of the present invention. In some embodiments, such as the embodiment described below, a photovoltaic (PV) module (e.g., PV module 102) is coupled to a power converter (e.g., power converter 104) for converting a first power from the PV module to a second power. The PV module comprises an array of PV cells (e.g., PV cells 110), where the individual PV cells may be connected to one another in strings (rows or columns) or in blocks. The PV cells within the PV module are configured to convert solar energy (e.g., from the sun or another source of photons) into direct current (DC), and form an output voltage for the PV module.

The method 700 begins at step 702 and proceeds to step 704. At step 704, a DC voltage is generated. In one or more embodiments, a first voltage, generated local to the PV cells, is converted to the DC voltage (referred to here as an electric field, or e-field, voltage), which is generally on the order of 1000s of volts. The first voltage may be either a DC voltage or an AC voltage. In some embodiments, an e-field voltage is generated from a DC voltage from the PV module (e.g., a DC voltage from the PV module is converted to the e-field voltage). In other embodiments, the power converter generates a DC voltage that is converted to an e-field voltage; in still other embodiments, the power converter generates an AC voltage that is converted to an e-field voltage.

The e-field voltage may be generated by a module of the power converter, such as charge pump 228; alternatively, the e-field voltage may be generated by a module separate and distinct from the power converter, such as the e-field voltage supply 608. In some embodiments, any one of a number of well known circuits for converting a DC or AC voltage to a specific DC voltage may be used to generate the e-field voltage. Such circuits include, but are not limited to, for example, switching power supplies.

The method 700 proceeds to step 706 where the generated DC voltage (i.e., the e-field voltage) is applied to the PV cell to create and maintain an electric field proximate a P-N junction of the PV cell, as previously described. The e-field voltage may be applied to an electrode (e.g., electrode 36 or 500) positioned proximate the PV cell P-N junction. In some embodiments, the electrode may be embedded in the PV cell; alternatively, the electrode may be retained between glass layers of the PV module.

In some embodiments, individual e-field voltages may be generated and applied to different sets of PV cells, such as different individual PV cells and/or different groupings of two or more PV cells. The individual e-field voltages may then be controlled to "tune" the efficiency of each group or individual PV cell. As such, the entire PV module may have the operation of individual PV cells or zones of PV cells optimized based on present operating conditions (e.g., illumination level, temperature, and the like).

The method 700 proceeds to step 708 where a determination is made whether to vary the generated DC voltage (i.e., the e-field voltage). The e-field voltage may be varied, for example, based on present operating conditions (e.g., illumination level, temperature, and the like) to optimally enhance the efficiency of the PV cells in converting received solar energy to electric current. If the result of the determination at step 708 is yes, that the voltage should be varied, the method 700 returns to step 704 to generate a new DC voltage. If the result of the determination at step 708 is no, that the voltage should not be varied, the method 700 proceeds to step 710.

At step 710, a determination is made whether to continue operating. If the result of such determination is yes, the method 700 returns to step 708; if the result of such determination is no, the method 700 proceeds to step 712 where it ends.

Figure 8:
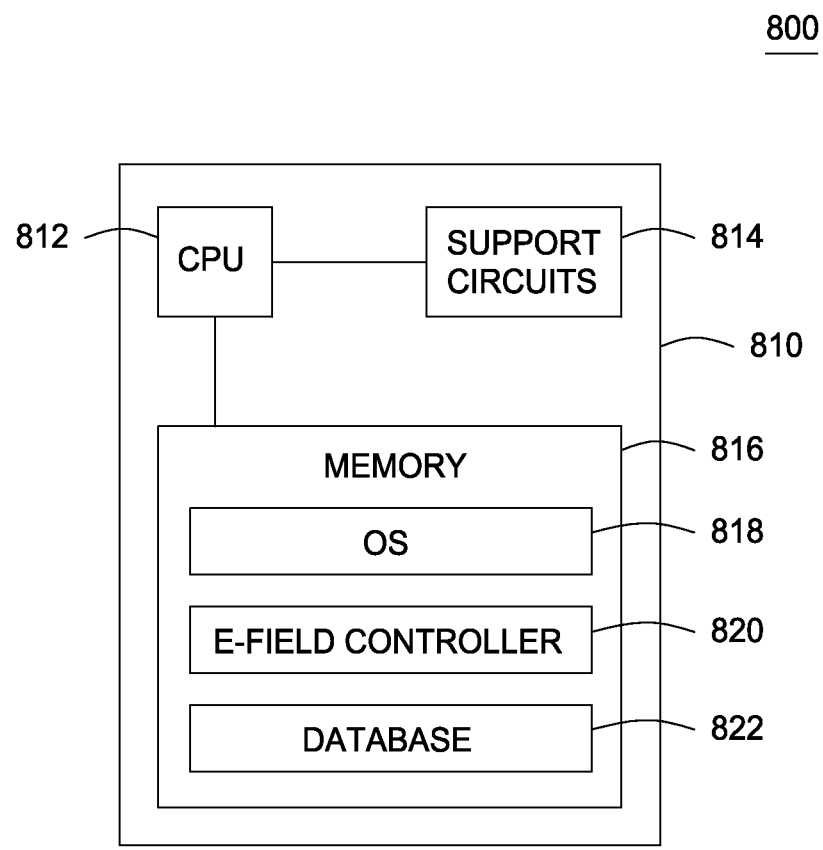
FIG. 8 is a block diagram of a controller in accordance with one or more embodiments of the present invention.

FIG. 8 is a block diagram of a controller 810 in accordance with one or more embodiments of the present invention. The controller 810 comprises at least one central processing unit (CPU) 812, which is coupled to support circuits 814 and to a memory 816. The CPU 812 may comprise one or more conventionally available microprocessors or digital signal processors (DSPs); additionally or alternatively, the CPU 812 may include one or more application specific integrated circuits (ASIC). The support circuits 814 are well known circuits used to promote functionality of the CPU 812. Such circuits include, but are not limited to, a cache, power supplies, clock circuits, buses, network cards, input/output (I/O) circuits, and the like. The controller 810 may be implemented using a general purpose processor that, when executing particular software, becomes a specific purpose processor for performing various embodiments of the present invention.

The memory 816 may comprise random access memory, read only memory, removable disk memory, flash memory, and various combinations of these types of memory. The memory 816 is sometimes referred to as main memory and may, in part, be used as cache memory or buffer memory. The memory 816 generally stores the operating system (OS) 818 of the controller 810. The OS 818 may be one of a number of commercially available operating systems such as, but not limited to, Linux, Real-Time Operating System (RTOS), and the like.

The memory 816 may store various forms of application software, such as an e-field controller 820 for controlling the generation of one or more e-field voltages in accordance with one or more embodiments of the present invention. For example, the e-field controller 820 may control the generation and/or level of one or more e-field voltages based on present operating conditions (e.g., illumination level, temperature, and the like) to optimally enhance the efficiency of one or more PV cells in converting received solar energy to electric current.

The memory 816 may further comprise a database 822 for storing data related to the present invention. In some embodiments, the e-field controller 820 and/or the database 822, or portions thereof, may be implemented in software, firmware, hardware, or a combination thereof.

The controller 810 may be a component of the power converter 104 for controlling one or more e-field voltages generated by the power converter 104; for example, the controller 810 may control the generation of the e-field by the charge pump 228. Alternatively, the controller 810 may be separate from the power converter 104. For example, the controller 810 may be a component of the e-field voltage supply 608 for controlling one or more e-field voltages generated by the voltage supply 608.

The foregoing description of embodiments of the invention comprises a number of elements, devices, circuits, and/or assemblies that perform various functions as described. These elements, devices, circuits and/or assemblies are exemplary implementations of means for performing their respectively described functions. For example, the charge pump 228 and the e-field voltage supply 608 are each examples of a means for converting a first voltage to an e-field voltage and coupling the e-field voltage to the at least one PV cell to create an electric field extending across the P-N junction, and the power converter 104 is an example of a means for converting a first power to a second power.

While the foregoing is directed to embodiments of the present invention, other and further embodiments of the invention may be devised without departing from the basic scope thereof, and the scope thereof is determined by the claims that follow.

The invention claimed is:

1. An apparatus for applying an electric field to a photovoltaic element, comprising:
   at least one photovoltaic (PV) cell having a P-N junction;
   a voltage supply for (i) converting a first voltage to an e-field voltage, the first voltage resulting from the at least one PV cell, and (ii) coupling the e-field voltage directly to an electrode that is positioned proximate the P-N junction of the at least one PV cell to create an electric field extending across the P-N junction.

2. The apparatus of claim 1, wherein the first voltage is generated by the at least one PV cell.

3. The apparatus of claim 1, wherein the first voltage is generated by a power converter coupled to the at least one PV cell for converting a first power from the at least one PV cell to a second power.

4. The apparatus of claim 3, wherein the first voltage is a DC voltage.

5. The apparatus of claim 3, wherein the first voltage is an AC voltage.

6. The apparatus of claim 3, wherein the power converter comprises the voltage supply.

7. The apparatus of claim 1, further comprising:
   a second at least one PV cell having a second P-N junction and a second electrode coupled proximate the second P-N junction; and
   a second voltage supply for (i) converting a second locally generated voltage to a second e-field voltage, the second locally generated voltage resulting from the second at least one PV cell, and (ii) coupling the second e-field voltage to the second at least one PV cell to create a second electric field extending across the second P-N junction, wherein the at least one PV cell and the second at least one PV cell are contained within a single PV module.

8. A method for applying an electric field to a photovoltaic element, comprising:
   generating an e-field voltage from a first voltage resulting from at least one photovoltaic (PV) cell, wherein the at least one PV cell has a P-N junction; and
   coupling the e-field voltage directly to an electrode positioned proximate the P-N junction of the at least one PV cell to create an electric field extending across the P-N junction.

9. The method of claim 8, further comprising varying the e-field voltage based on at least one operating condition.

10. The method of claim 8, wherein the first voltage is generated by the at least one PV cell.

11. The method of claim 8, wherein the first voltage is generated by a power converter coupled to the at least one PV cell for converting a first power from the at least one PV cell to a second power.

12. The method of claim 11, wherein the first voltage is a DC voltage.

13. The method of claim 11, wherein the first voltage is an AC voltage.

14. The method of claim 8, further comprising:
   generating a second e-field voltage from a second locally generated voltage, the second locally generated voltage resulting from a second at least one photovoltaic (PV) cell having a second P-N junction; and
   coupling the second e-field voltage to the second at least one PV cell to create a second electric field extending across the second P-N junction, wherein the at least one PV cell and the second at least one PV cell are contained within a single PV module.

15. A system for applying an electric field to a photovoltaic element, comprising:
   at least one photovoltaic (PV) cell having a P-N junction;
   a power converter, coupled to the at least one PV cell, for converting a first power from the at least one PV cell to a second power; and
   a voltage supply for (i) converting a first voltage to an e-field voltage, the first voltage resulting from the at least one PV cell, and (ii) coupling the e-field voltage directly to an electrode positioned proximate the P-N junction of the at least one PV cell to create an electric field extending across the P-N junction.

16. The system of claim 15, wherein the first voltage is generated by the at least one PV cell.

17. The system of claim 15, wherein the first voltage is generated by the power converter.

* * * * *